(12) United States Patent
Allott

(10) Patent No.: US 6,747,521 B1
(45) Date of Patent: Jun. 8, 2004

(54) ANALOG MEMORY CELL IN A LOW POWER OSCILLATOR

(75) Inventor: Stephen Allott, Scotts Valley, CA (US)

(73) Assignee: Zeevo, Inc., San Jose, CA (US)

( * ) Notice: Subject to any disclaimer, the term of this patent is extended or adjusted under 35 U.S.C. 154(b) by 0 days.

(21) Appl. No.: 10/206,256

(22) Filed: Jul. 26, 2002

(51) Int. Cl.$^7$ ................................. H03L 7/08
(52) U.S. Cl. ................ 331/175; 331/17; 331/176
(58) Field of Search .................. 331/175, 17, 176, 331/177, 14, 34, 18, 177 R; 327/147, 156

(56) References Cited

U.S. PATENT DOCUMENTS 4,054,078 A  * 10/1977 Kondo .................... 84/648
5,818,302 A  * 10/1998 Otsuka et al. ............ 331/17
6,392,496 B1 *  5/2002 Lee et al. ................. 331/17

* cited by examiner

Primary Examiner—Linh M. Nguyen
(74) Attorney, Agent, or Firm—Martine & Penilla, LLP

(57) ABSTRACT

An analog memory cell that may be incorporated into a low power oscillator is provided. The analog memory cell stores an analog voltage as a digital signal and converts the digital signal back to an analog voltage to allow continued generation of an accurate constant output voltage regardless of temperature-dependent leakage currents associated with parasitic diodes and non-ideal devices. The accurate constant output voltage provided by the analog memory cell may be used by the low power oscillator to generate an accurate low frequency output signal. This accurate low frequency output signal may be used to maintain long-term timing accuracy in host devices during sleep modes of operation. Incorporation of the analog memory cell in the low power oscillator is fully implementable in a CMOS process.

20 Claims, 10 Drawing Sheets

ANALOG MEMORY CELL IN A LOW POWER OSCILLATOR

BACKGROUND OF THE INVENTION

1. Field of the Invention

The present invention relates to digital circuit timing accuracy and, more particularly, to techniques for using an analog memory cell in a low power oscillator to maintain long-term timing accuracy in sleep mode without reliance on an external crystal.

2. Description of the Related Art

It is common for today's electronic devices to incorporate combinations of analog and digital circuitry. Many of these devices, such as cellular phones, operate in mobile environments where design characteristics are being pushed to meet higher consumer demands. These demands include smaller, more compact devices with longer battery life at a lower overall cost. In order to meet these demands, analog and digital circuitry should be combined more efficiently and in a manner that will reduce power consumption.

In an attempt to conserve power, many devices implement a sleep mode when not in use. It is known, for example, that incorporation of a sleep mode in cellular phone devices may extend battery life by up to a factor of 10. A key objective when designing portable electronic devices is to minimize the amount of current used while in sleep mode. In addition to minimizing the amount of current used while in sleep mode, the device should also be able to retain some level of timing accuracy for a minimum duration as dictated by the application.

To maintain the required level of timing accuracy while in sleep mode, most devices use a sleep mode oscillator. It is common in modern designs to use a low-power, low-frequency crystal on the printed circuit board for the sleep mode oscillator. This low-power crystal is external to the semiconductor chips and is present in addition to an external master crystal which is used during normal operation.

FIG. 1, while not to scale, shows a prior art printed circuit board (PCB) device 101, including a semiconductor chip 103, an external master crystal 115, and an external low-power crystal 117. The semiconductor chip 103 may contain a digital core 105, an analog component 107, a digital component 109, a radio frequency (RF) component 111, or other circuitry 113. The semiconductor chip 103 receives a signal 119 from either the master crystal 115 or the low-power crystal 117, depending on the mode of operation.

The use of the second external low-power crystal 117 presents several disadvantages relative to design optimization. An obvious disadvantage is that the second external low-power crystal 117 takes up valuable space on the PCB device 101. FIG. 1 is not to scale; in actuality the external master crystal 115 and external low-power crystal 117 are of relatively large size, comparable to the size of the semiconductor chip 103 itself. Therefore, addition of the second external low-power crystal 117 can be significant to overall PCB device 101 size. Another disadvantage is that adding the second external low-power crystal 117 increases the expense of the overall PCB device 101. A less obvious disadvantage is that the external low-power crystal 117 requires the semiconductor chip 103 to have a pin available for interface connection. As the semiconductor chip 103 has a limited number of pins available, dedication of a pin to the external low-power crystal 117 may be costly relative to design restrictions and complications. Furthermore, the routing required to connect the semiconductor chip 103 to the external low-power crystal 117 uses valuable PCB device 101 area and adds expense. Two objectives in the industry are to move toward smaller devices and minimize cost. Adding the second external low-power crystal 117 to the PCB device 101 does not comply with these two objectives. Therefore, the focus of attention is to remove the external low-power crystal 117 used to support the sleep mode of operation.

FIG. 2 shows the PCB device 101 from FIG. 1 with the external low-power crystal 117 removed. Additionally, FIG. 2 shows a low power oscillator (LPO) 121 receiving a clock reference signal 123 from the external master crystal 115 and providing a low frequency output signal 125 to the digital core 105. As a substitute for the external low-power crystal 117, one requirement of the LPO 121 is to derive a lower frequency signal from a higher frequency signal. The temperature stability of the LPO 121 is a typical consideration when replacing the external low-power crystal 117. A feature of an on-board crystal is that changes in frequency due to changes in temperature are minimized, whereas a free-running oscillator will change in frequency significantly with temperature. However, one known method for designing the LPO 121 to be temperature stable is to use a conventional phase lock loop (PLL) 122, as shown in FIG. 3.

FIG. 3 shows the conventional PLL 122 used to derive a lower frequency signal from a higher frequency signal. The conventional PLL 122 takes an accurate clock reference signal 123 from the external master crystal 115. The clock reference signal 123 is passed to a reference divider 129, via a connection 127, which divides the clock reference signal 123 down to a lower frequency signal. The output signal from the reference divider 129 is then passed to a phase frequency detector (PFD) 133 via a connection 131. The PFD 133 generates an output signal which is passed through a connection 135 to control a charge pump 137. The charge pump 137, in turn provides an output signal which is passed through a connection 139 to control a voltage controlled oscillator (VCO) 145. The VCO 145 provides a low frequency output signal 125 from the conventional PLL 122 via a connection 146. The VCO 145 low frequency output signal 125 is also passed to an N-counter 149, via a connection 147. The N-counter 149 generates an output signal which is provided to the PFD 133 via a connection 151. An N value of the N-counter 149 can be set arbitrarily; however, the N value remains fixed. Due to the conventional PLL 122 functionality, the VCO 145 output frequency is equal to the N value of the N-counter 149 times the N-counter 149 output frequency. The conventional PLL 122 function is to make both input signals to the PFD 133 match in both frequency and phase. The PFD 133 makes a decision on whether or not the VCO 145 output signal frequency should be higher or lower, depending on what is required to match the reference input signal frequency, received through connection 131, to the N-counter 149 output signal frequency received through connection 151. Thus, the conventional PLL 122 is a closed-loop, negative feedback circuit.

Due to the way the PFD 133 functions and the accuracy of the clock reference signal 123 entering the PFD 133 via the reference divider 129, the accuracy of the VCO 145 low frequency output signal 125 will equal the accuracy of the clock reference signal 123. Therefore, obtaining a desired low frequency output signal 125 accuracy is accomplished by requiring the clock reference signal 123 to have a better accuracy.

Through use of the conventional PLL 122 featuring closed-loop, negative feedback, the consistent low frequency output signal 125 is derived from the clock reference signal 123 and is maintained regardless of changes in temperature. Thus, the closed-loop, negative feedback conventional PLL 122 alleviates the need for the additional external low-power crystal 117 to produce a low frequency reference clock signal to be used in sleep mode. However, power conservation while in sleep mode requires that the external master crystal 115 be turned off.

One feature of the conventional PLL, 122 is that it has a flywheel effect. This means that once the loop is locked, if the loop is broken, the output of the VCO 145 will stay at the same frequency for a short period of time. This stems from the fact that as long as a voltage V, as shown in FIG. 3, at the input to the VCO 145 remains constant, the output frequency from the VCO 145 will remain constant. To take advantage of the conventional PLL 122 flywheel effect when the master crystal 115 is turned off, such as when entering sleep mode, the input voltage to the VCO 145 should be maintained at a constant level.

FIG. 4 shows the conventional PLL 122 in an opened state where the clock reference signal 123, the reference divider 129, the PFD 133, the charge pump 137, and the N-counter 149 are turned off as indicated by a slash 153. As shown in FIGS. 3, 4, and 5, the conventional PLL 122 incorporates a loop filter 144 at input connection 139 to the VCO 145. The loop filter 144 includes a resistor 141 coupled to a capacitor 143. The coupling of resistor 141 and capacitor 143 serves to stabilize the input voltage V to the VCO 145. Opening of the conventional PLL 122 may be thought of as a switch 155, as shown in FIG. 5, to the input of the VCO 145.

FIG. 5 shows the circuit diagram of the conventional PLL 122 between the charge pump 137 and the VCO 145. Switch 155 is in line with connection 139 which provides input to the VCO 145. The coupled resistor 141 and capacitor 143 are in line with the input to the VCO 145 to facilitate maintaining a constant VCO 145 input voltage V. If the switch 155 were considered ideal and the voltage V at the input to the VCO 145 were to remain constant, the frequency of the low frequency output signal 125 would remain constant. Unfortunately, due to tolerances and imperfections in the complementary metal oxide silicon (CMOS) process used to make semiconductor chips, a leakage current $I_1$ 159 and a leakage current $I_2$ 161 flow from the capacitor 143 through parasitic P-N junction diodes on the silicon. Also, leakage currents flowing through parasitic P-N junction diodes within the VCO 145 are symbolized by the presence of a diode 157 in FIG. 5. Thus, the presence of leakage current is simply due to the nature of the CMOS process used to create semiconductor chips.

Even though leakage currents through the parasitic P-N junction diodes are very small, they can have a significant effect on the voltage V at the input to the VCO 145. The high sensitivity of the VCO 145 input voltage V to leakage currents $I_1$ 159 and $I_2$ 161 is partially due to the high impedance present when looking through a node 140 toward the entrance of the VCO 145 and back toward the switch 155. Furthermore, due to the high gain (i.e., Hz/V) of a typical VCO 145, a small change in current may cause a change in the VCO 145 input voltage V sufficiently large to in turn cause the VCO 145 output frequency to fall outside of an acceptable range. For example a typical VCO 145 may have a gain of 20 kHz per Volt. If this typical VCO 145 requires an output frequency accuracy of ±4 Hz, a change in VCO 145 input voltage V of more than 0.2 mV will cause the VCO 145 output frequency to be unacceptable. The time required for the leakage currents $I_1$ 159 and $I_2$ 161 to cause an unacceptably large change in VCO 145 input voltage V is typically very short (i.e., less than one second). This basically means that a device using a conventional PLL 122 would be required to return from sleep mode quite frequently (i.e., about every second or less) despite the absence of a user operation signal. If the device has sufficient computing capability and battery life, a frequency hold time (i.e., sleep mode duration) of less than one second may be tolerable. However, for small mobile devices that are limited in computing power by variables such as cost, size, and power consumption, it is desirable to have the capability of maintaining longer sleep mode operation times (i.e., longer VCO 145 input voltage V hold times).

In view of the foregoing, there is a need for a device that avoids the problems of the prior art by providing a temperature-stable, low power consumption, CMOS process implementable, size-efficient method for generating an accurate reference clock signal that can be used to support long sleep mode operation times in systems where optimization of size, cost, and battery life are paramount.

SUMMARY OF THE INVENTION

Broadly speaking, the present invention fills these needs by providing apparatuses and methods for an analog memory cell that can be used in a low power oscillator to generate an accurate reference clock signal to support a long sleep mode operation time in an electronic device. It should be appreciated that the present invention can be implemented in numerous ways, including as a process, an apparatus, a system, a device, or a method. Several embodiments of the present invention are described below.

In one embodiment, a low power oscillator is disclosed. The low power oscillator comprises a voltage controlled oscillator having an input and an output. The output of the voltage controlled oscillator is configured to provide an output signal of substantially constant frequency. The low power oscillator further comprises an analog memory cell in electrical communication with the input of the low power oscillator. The analog memory cell is configured to provide a voltage to the input of the voltage controlled oscillator. The analog memory cell comprises digital circuitry that includes a latch. The analog memory cell further comprises digital-to-analog conversion circuitry for receiving data from the latch and outputting the voltage to the input of the voltage controlled oscillator. The voltage provided to the voltage controlled oscillator from the digital-to-analog conversion circuitry remains substantially constant when the latch is activated.

In another embodiment, an analog memory cell is disclosed. The analog memory cell comprises digital-to-analog conversion circuitry configured to receive a first digital control signal and provide an output voltage. The analog memory cell also comprises comparator circuitry in electrical communication with the digital-to-analog conversion circuitry. The comparator circuitry is configured to receive the output voltage from the digital-to-analog conversion circuitry. The comparator circuitry is further configured to receive an input voltage. The comparator circuitry is configured to compare the output voltage received from the digital-to-analog conversion circuitry to the input voltage to generate a second digital control signal. The comparator circuitry further comprises digital circuitry in electrical communication with both the comparator circuitry and the digital-to-analog conversion circuitry. The digital circuitry comprises a successive approximation logic block, an integration logic block, and a digital signal latch. The digital circuitry is configured to receive the second digital control signal from the comparator circuitry. The second digital control signal is processed through either the successive approximation logic block or the integration logic block to generate the first digital control signal. The digital signal latch is capable of latching the first digital control signal.

In yet another embodiment, a method for providing a substantially constant voltage to operate a low power oscillator is disclosed. The method comprises operating a phase lock loop that includes an analog memory cell. The analog memory cell is operated in a coarse mode to acquire a lock of the phase lock loop. With a lock of the phase lock loop acquired, the analog memory cell is operated in a fine mode. The method further comprises latching a digital signal in the analog memory cell to provide an input to the digital-to-analog conversion circuitry.

The advantages of the present invention are numerous. The analog memory cell incorporated into a low power oscillator as disclosed in the present invention provides a device and method for generating an accurate reference clock signal. The accurate reference clock signal can be used to support long sleep mode operation times. Furthermore, the present invention avoids the problems of the prior art by providing a temperature-stable, low power consumption, CMOS process implementable, size-efficient method for generating the accurate reference clock signal. Thus, the advantages of the present invention are especially useful in systems where optimization of size, cost, and battery life are paramount.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for an analog memory cell incorporated into a low power oscillator. The analog memory cell of the present invention successfully stores an analog voltage as a digital signal and converts the digital signal back to an analog voltage. The analog memory cell allows continued generation of an accurate constant output voltage regardless of temperature-dependent leakage currents associated with parasitic diodes and non-ideal devices. The accurate constant output voltage provided by the analog memory cell may be used by the low power oscillator to generate an accurate low frequency output signal. This accurate low frequency output signal may be used to maintain long-term timing accuracy in host devices during sleep modes of operation when an external crystal is not available to provide a clock signal. Further, incorporation of the analog memory cell in the low power oscillator is fully implementable in a CMOS process. Therefore, the analog memory cell incorporated into the low power oscillator as disclosed in the present invention avoids the problems of the prior art by providing a temperature-stable, low power consumption, CMOS process implementable, size-efficient method for generating an accurate reference clock signal that can be used to support long sleep mode operation times in systems where optimization of size, cost, and battery life are paramount.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
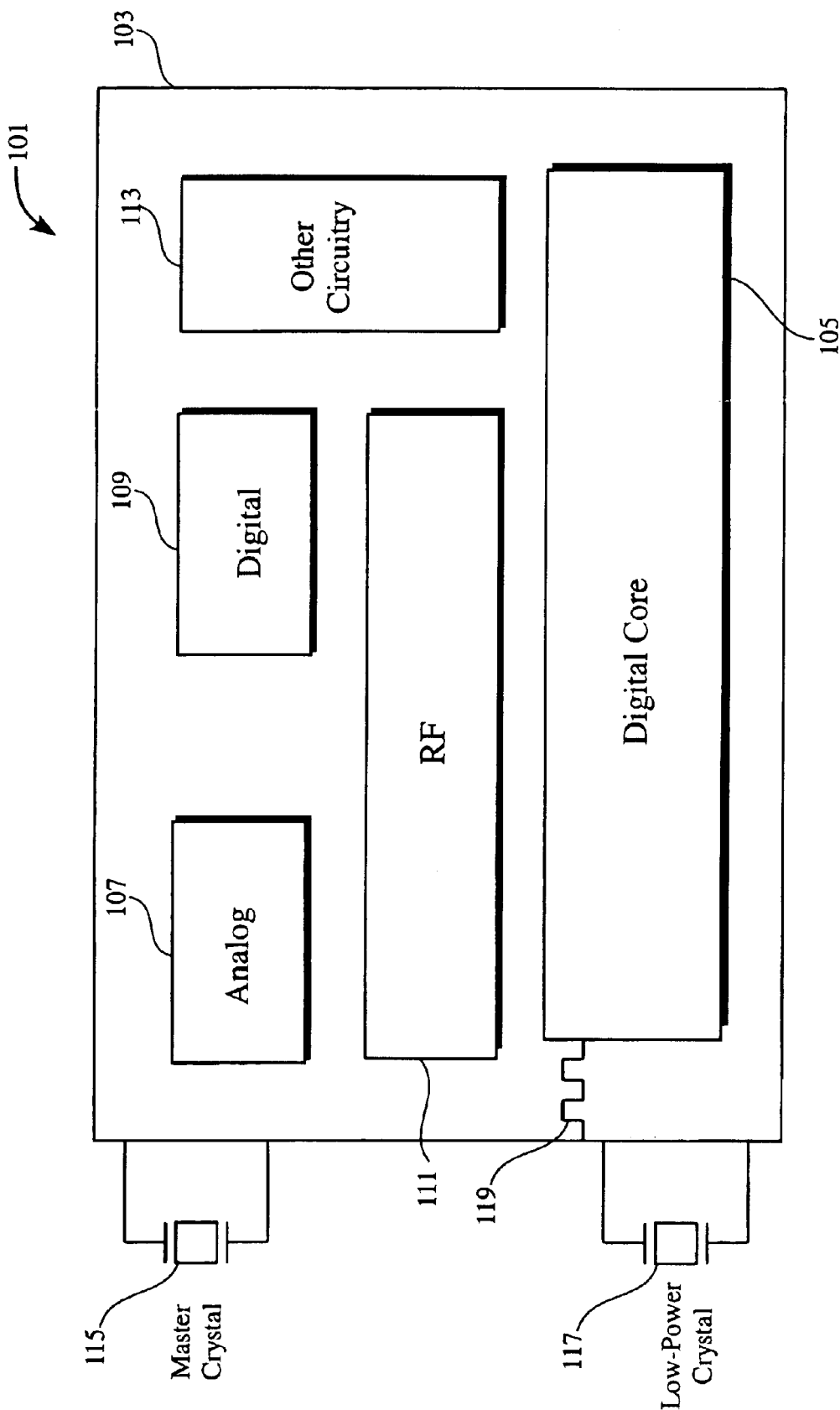
FIG. 1 is an illustration showing a prior art printed circuit board device including a semiconductor chip, an external master crystal, and an external low-power crystal.
Figure 2:
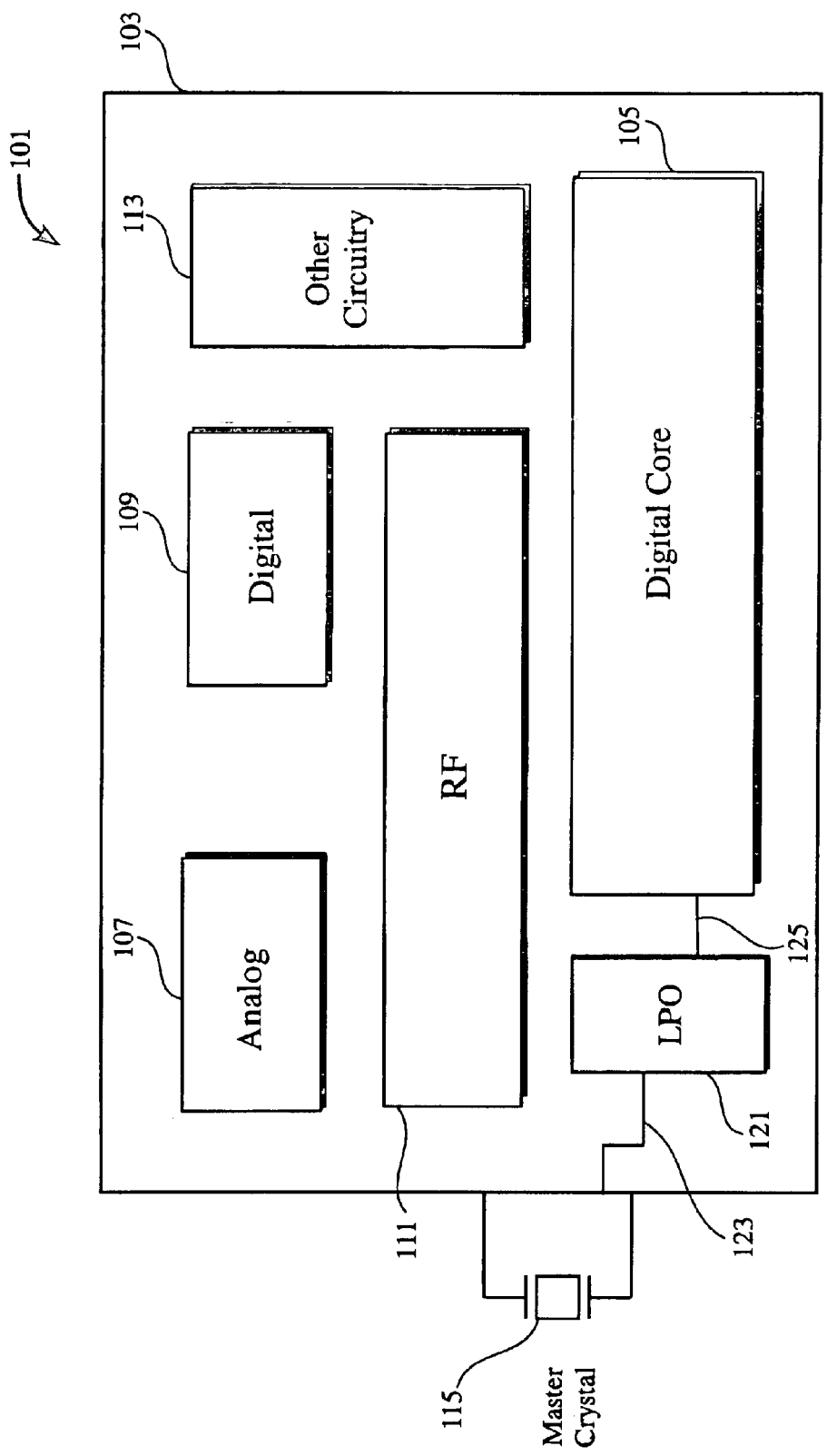
FIG. 2 is an illustration showing a prior art printed circuit board device with an external low-power crystal removed.
Figure 3:
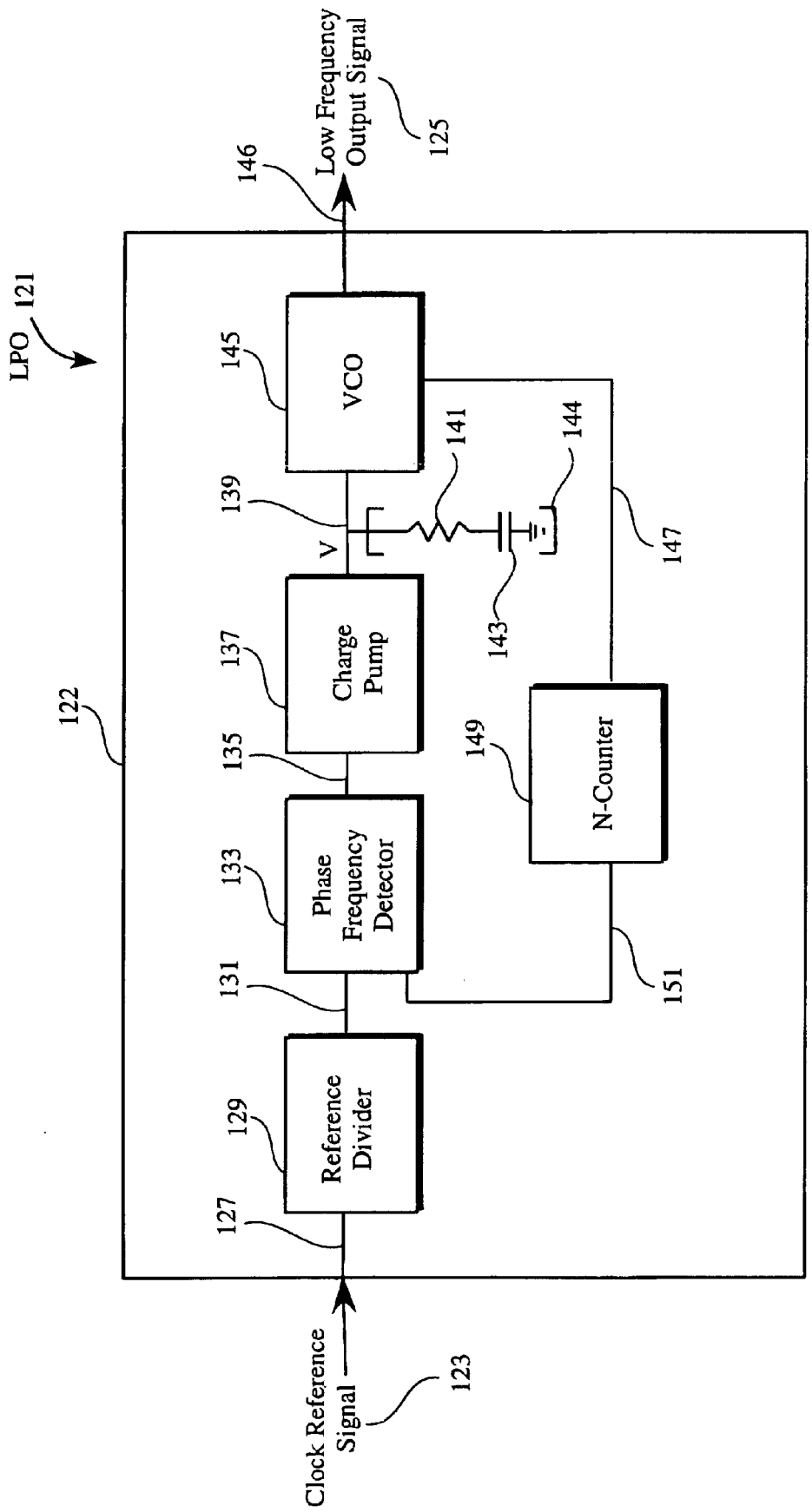
FIG. 3 is an illustration showing a prior art conventional phase lock loop used to derive a low frequency output signal from a clock reference signal.
Figure 4:
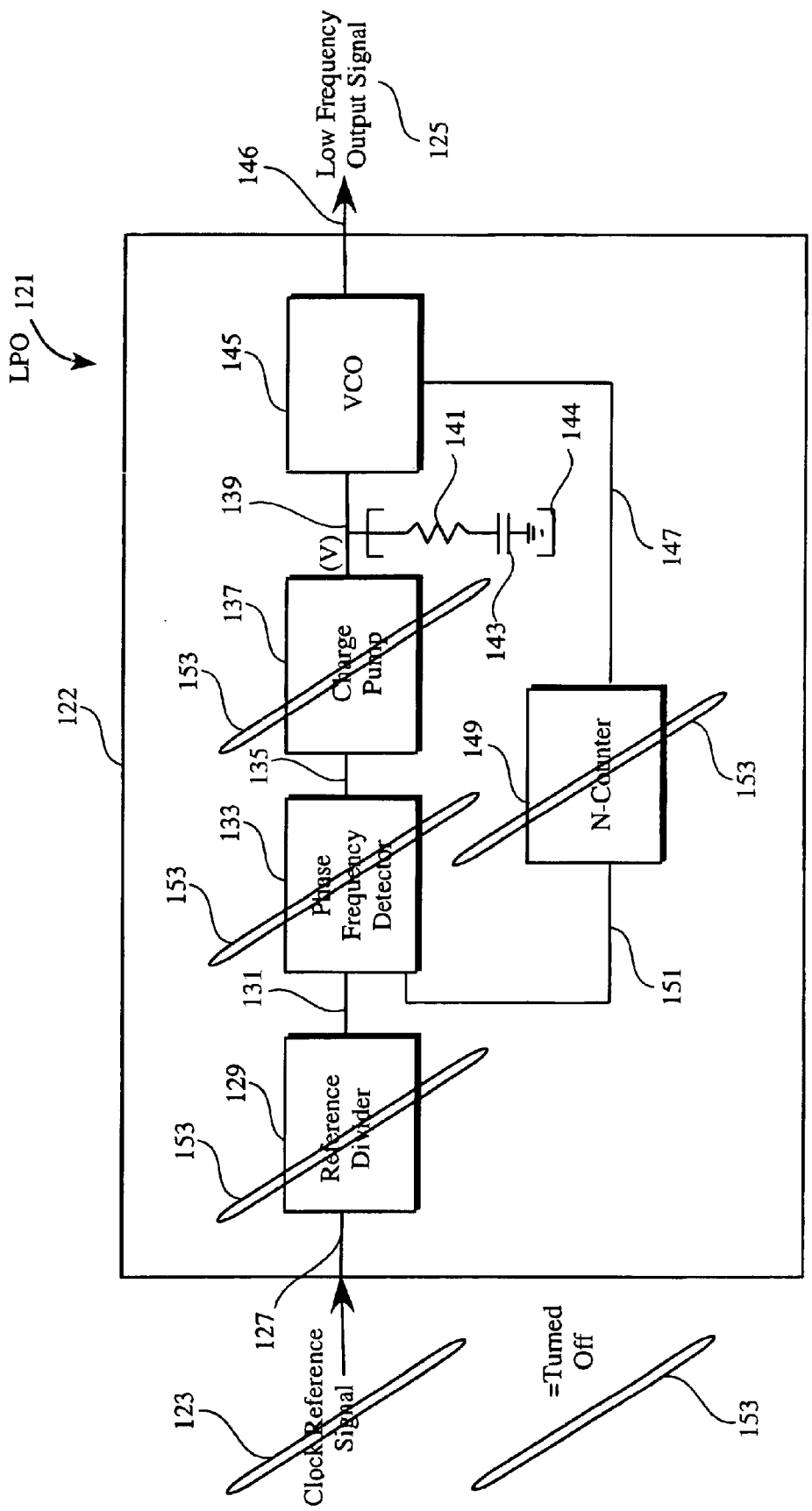
FIG. 4 is an illustration showing a prior art conventional phase lock loop in an open state where a clock reference signal, a reference divider, a phase frequency detector, a charge pump, and an N-counter are turned off.
Figure 5:
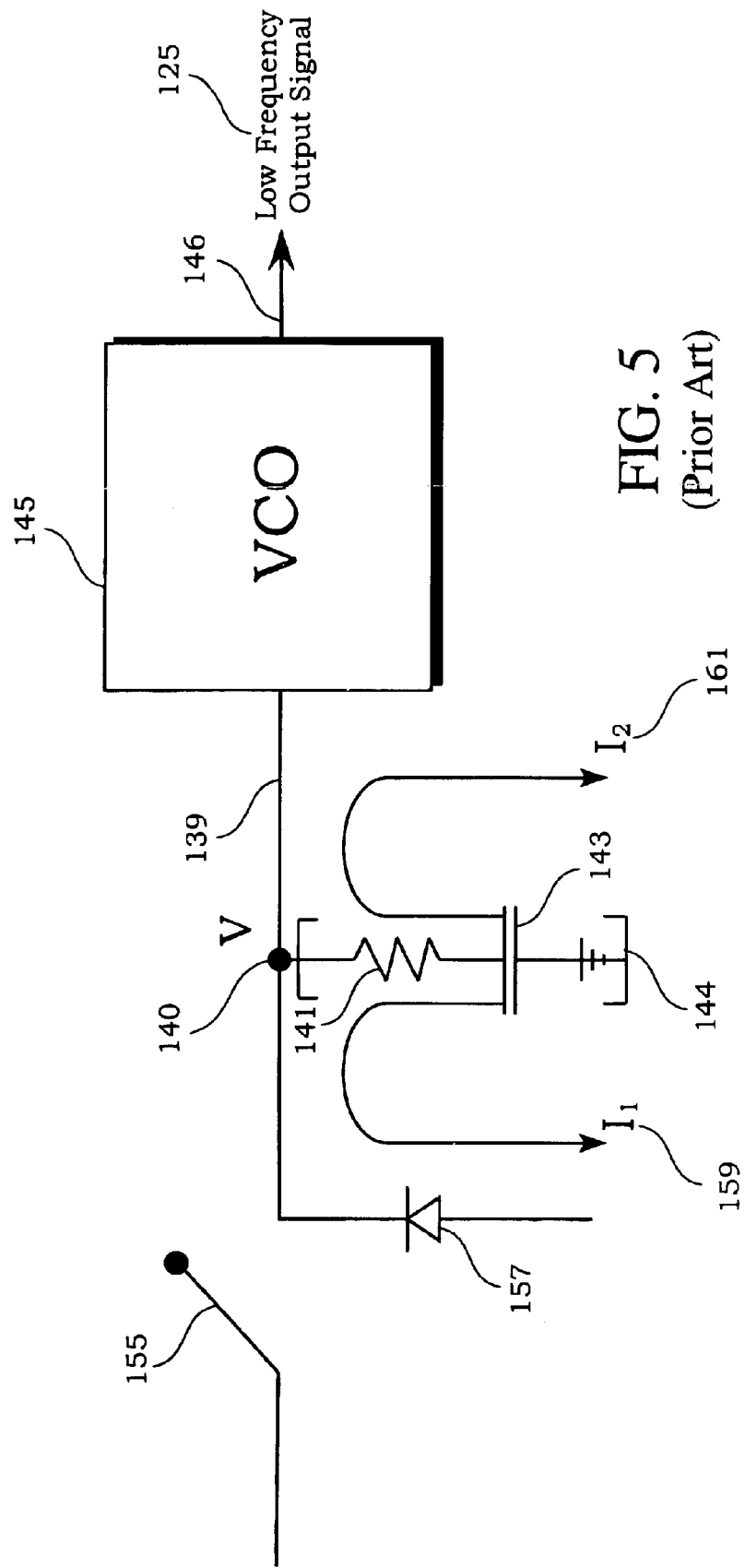
FIG. 5 is an illustration showing a circuit diagram of a prior art conventional phase lock loop between a charge pump and a voltage controlled oscillator.
Figure 6:
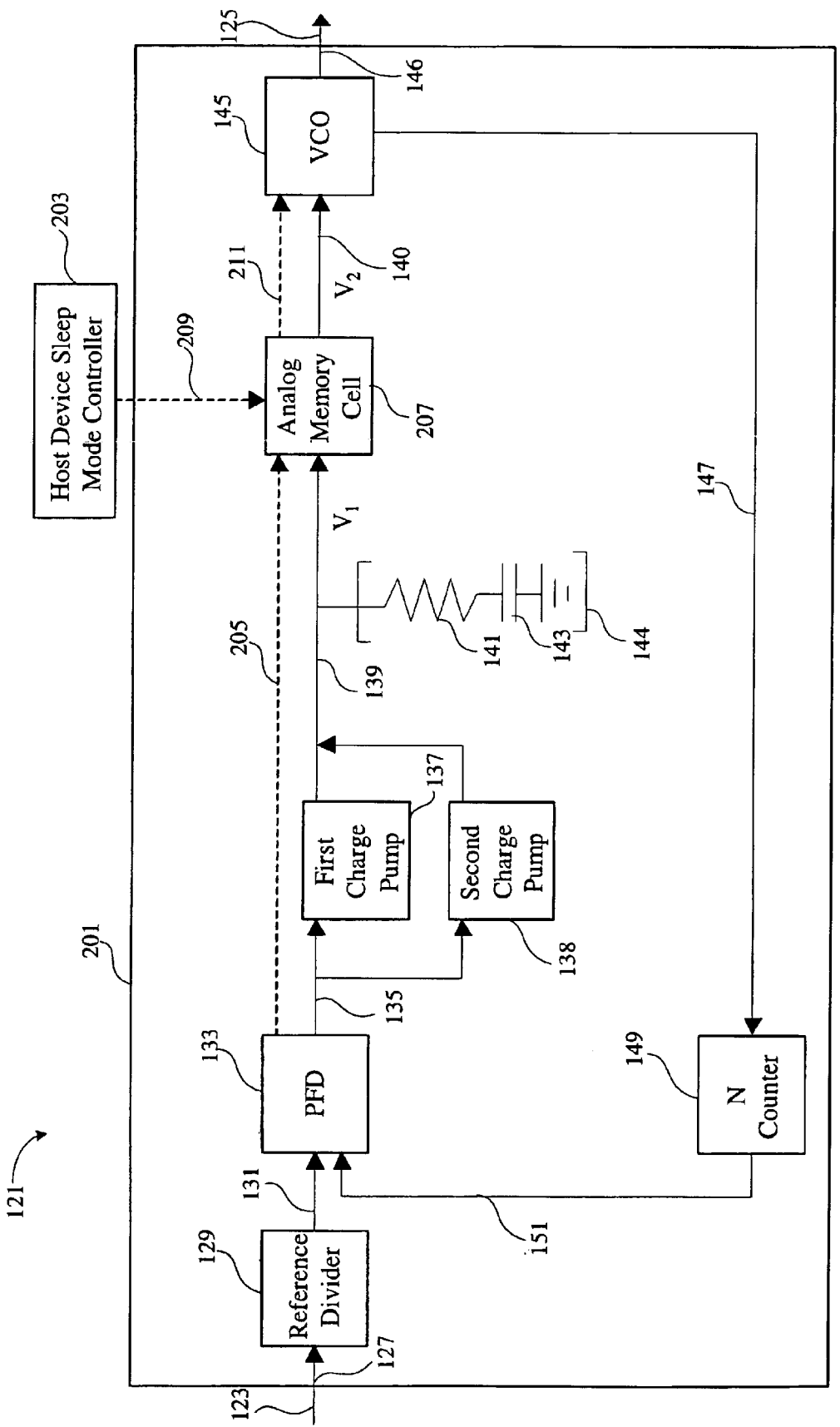
FIG. 6 is an illustration showing a modified phase lock loop that uses an analog memory cell, in accordance with one embodiment of the present invention.

FIG. 6 shows a modified phase lock loop (PLL) 201 that uses an analog memory cell 207, in accordance with one embodiment of the present invention. The modified PLL 201 derives a low frequency output signal 125 from a clock reference signal 123. The modified PLL 201 accepts the clock reference signal 123 which is passed to a reference divider 129 via a connection 127. The reference divider 129 divides the clock reference signal 123 down to a lower frequency signal. In a preferred embodiment of the present invention, the reference divider 129 receives a 12 MHz input signal and divides it down to an output signal of approximately 8 kHz. The output signal from the reference divider 129 is then passed to a phase frequency detector (PFD) 133 via a connection 131. The PFD 133 generates an output signal which is passed through a connection 135 to control either a first charge pump 137 or a second charge pump 138 (collectively called the charge pumps). The decision to use either the first charge pump 137 or the second charge pump 138 is determined by the PFD 133 based on an operational mode of the analog memory cell 207. Both the first charge pump 137 and the second charge pump 138 are capable of generating a voltage $V_1$ which is passed through a connection 139 to the analog memory cell 207. The analog memory cell 207 provides a voltage $V_2$ that is passed to a voltage controlled oscillator (VCO) 145 through a connection 140. The analog memory cell 207 also provides a digital signal to the VCO 145 through a connection 211 to control a gain response function of the VCO 145. The VCO 145 generates the low frequency output signal 125 which is output from the modified PLL 201 through a connection 146. The low frequency output signal 125 generated by the VCO 145 is also passed to an N-counter 149 via a connection 147. The N-counter 149 generates an output signal which is provided to the PFD 133 via a connection 151.

A resistor 141 is coupled to a capacitor 143 at connection 139 between the charge pumps and the analog memory cell 207 to form a loop filter 144 that assists in maintaining the voltage $V_1$ provided to the analog memory cell 207. The analog memory cell 207 receives a digital signal from the PFD 133 through a connection 205 to indicate that a loop voltage of the modified PLL 201 is within an acceptable range to be locked. The analog memory cell 207 also receives a digital signal from a host device's (e.g., cell phone or any other portable electronic device) sleep mode controller 203 through a connection 209 to indicate that the host device is ready to enter a sleep mode (i.e., low power mode) of operation.

An N value of the N-counter 149 can be set arbitrarily; however, the N value remains fixed. Due to the modified PLL 201 functionality, the VCO 145 output frequency is equal to the N value of the N-counter 149 multiplied by the N-counter 149 output frequency. In a preferred embodiment of the present invention, the N value is set to 4 and the output frequency of the N-counter is 8 kHz, thus resulting in a VCO 145 output frequency of 32 kHz. The modified PLL 201 function is to make both input signals to the PFD 133 match in both frequency and phase. The PFD 133 makes a decision on whether or not the VCO 145 output signal frequency should be higher or lower. This decision depends on what is required to match the reference input signal frequency (received via connection 131) to the N-counter 149 output signal frequency (received via connection 151). Based on the PFD 133 decision, the actively controlled charge pump is adjusted to affect the VCO 145 output signal frequency. Therefore, the modified PLL 201 is a closed-loop, negative feedback circuit. The closed-loop, negative feedback behavior of the modified PLL 201 serves to maintain the low frequency output signal 125 generated by the VCO 145 at a substantially constant frequency.

Figure 7:
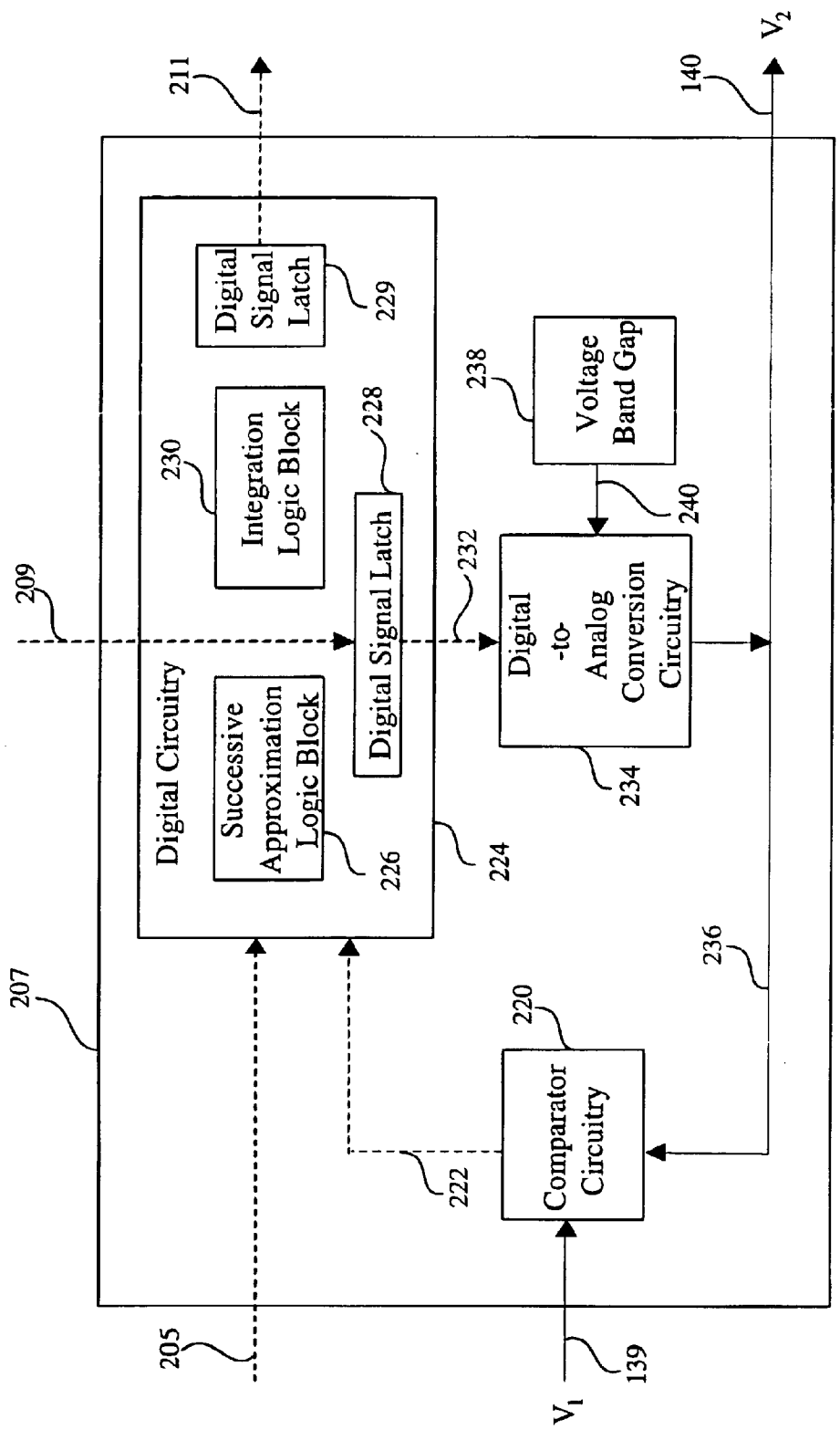
FIG. 7 is an illustration showing an analog memory cell, in accordance with one embodiment of the present invention.

FIG. 7 shows the analog memory cell 207, in accordance with one embodiment of the present invention. The analog memory cell 207 comprises digital-to-analog conversion circuitry 234, comparator circuitry 220, and digital circuitry 224 in electrical communication with both the comparator circuitry 220 and the digital-to-analog conversion circuitry 234. The entire conglomeration of analog memory cell 207 circuitry is configured to operate in a linear manner. The digital-to-analog conversion circuitry 234 receives, through a connection 232 from the digital circuitry 224, a first digital control signal representing a voltage. The digital-to-analog conversion circuitry 234 converts the voltage represented by the first digital control signal to an analog voltage. The analog voltage generated by the digital-to-analog conversion circuitry 234 is provided to the comparator circuitry 220 through a connection 236. Also, the analog voltage generated by the digital-to-analog conversion circuitry 234 is provided as voltage $V_2$ to the VCO 145 input through connection 140. The comparator circuitry 220 also receives the voltage $V_1$ through connection 139 as an analog input voltage. The comparator circuitry 220 compares the voltage $V_2$ to the voltage $V_1$ to generate a second digital control signal. The second digital control signal provides an indication as to whether the voltage $V_2$ is greater than or less than the voltage $V_1$. The second digital control signal is provided to the digital circuitry 224 through a connection 222.

The digital circuitry 224 comprises a successive approximation logic block 226, an integration logic block 230, and a first digital latch 228. Based on the second digital control signal received from the comparator circuitry 220, the digital circuitry 224 generates an updated first digital control signal which is then passed to the digital-to-analog conversion circuitry 234. The digital circuitry 224 is capable of operating in either a successive approximation mode using the successive approximation logic block 226 or an integration mode using the integration logic block 230. The digital circuitry 224 mode of operation is dictated by a third digital control signal received from the PFD 133 through a connection 205. While the PFD 133 is acquiring a lock on the loop voltage, the digital circuitry 224 operates in the successive approximation mode with the successive approximation logic block 226 active and the integration logic block 230 inactive. When the PFD 133 acquires the lock on the loop voltage, the third digital control signal is passed to the digital circuitry 224. Upon receipt of the third digital control signal indicating loop lock, the digital circuitry 224 switches from successive approximation mode to integration mode. In integration mode, the integration logic block 230 is active and the successive approximation logic block 226 is inactive.

The successive approximation logic block 226 modifies the first digital control signal sent to the digital-to-analog conversion circuitry 234 in a coarser manner than the integration logic block 230. Use of the successive approximation mode allows the analog memory cell 207 output voltage ($V_2$) to be adjusted more quickly to expedite the acquisition of the loop lock voltage by the PFD 133. The successive approximation mode is capable of monotonically resolving any voltage in a number of clock cycles equivalent to the accuracy of the digital-to-analog conversion circuitry 234. For example, using the successive approximation mode, a voltage can be monotonically resolved on 13-bit accurate digital-to-analog conversion circuitry 234 in 13 clock cycles.

The integration mode allows the analog memory cell 207 to track the voltage $V_1$ on a finer scale to maintain the voltage $V_2$ in a substantially constant manner. The integration mode is capable of finely adjusting the voltage $V_2$ either up or down by modifying the first digital control signal provided to the digital-to-analog conversion circuitry 234 in steps of one least significant bit at a time. While operating in the integration mode, the digital circuitry 224 is capable of activating the first digital latch 228 such that the first digital control signal provided to the digital-to-analog conversion circuitry 234 will be latched at a constant value. Activation of the first digital latch 228 by the digital circuitry 224 occurs in response to a fourth digital control signal received through connection 209 from the host device's sleep mode controller 203. The fourth digital signal instructs the first digital latch 228 to activate so that the host device can enter a sleep mode of operation.

While operating in the successive approximation mode, the PFD 133 controls the first charge pump 137. Conversely, while operating in the integration mode, the PFD 133 controls the second charge pump 138 which generates a lower voltage than the first charge pump 137. In a preferred embodiment, the second charge pump 138 uses a current equal to about one-tenth that used by the first charge pump 137. Switching between the first charge pump 137 and the second charge pump 138 when transitioning between the successive approximation mode and the integration mode causes the gain of the modified PLL 201 to be reduced. Reducing the gain of the modified PLL 201 beneficially reduces the susceptibility of the modified PLL 201 circuit to disruptions potentially caused by environmental noise.

The digital-to-analog conversion circuitry 234 is powered by a voltage band gap 238 through a connection 240. Once the first digital control signal from the digital circuitry 224 to the digital-to-analog conversion circuitry 234 is latched, all circuitry other than the voltage band gap 238, the digital-to-analog conversion circuitry 234, and the VCO 145 can be powered off to enter the sleep mode of operation. During the sleep mode of operation, the digital-to-analog conversion circuitry 234 continues to generate the voltage $V_2$ corresponding to the latched first digital control signal in an accurate and stable manner. Therefore, as long as the voltage band gap 238 continues to supply power to the digital-to-analog conversion circuitry 234, the VCO 145 will continue to receive the substantially constant input voltage $V_2$. Correspondingly, as long as the VCO 145 continues to be supplied with the substantially constant input voltage $V_2$, the low frequency output signal 125 will continue to be generated in a substantially constant manner.

With the first digital control signal latched and the digital-to-analog conversion circuitry 234 controlling the input to the VCO 145, the accuracy of the low frequency output signal 125 generated by the VCO 145 is effectively dictated by the accuracy of the digital-to-analog conversion circuitry 234. The required accuracy of the digital-to-analog conversion circuitry 234 for a particular application is dependent on the VCO 145 gain ($K_{VCO}$) in units of (Hz/V), the voltage $V_2$ provided as input to the VCO 145, and the required accuracy of the low frequency output signal 125 generated by the VCO 145 in units of (parts per million or ppm). The digital-to-analog conversion circuitry 234 accuracy requirement is represented by a least significant bit (lsb) requirement.

The following exemplary embodiment of the present invention describes the relationship between the VCO 145 gain, the VCO 145 input voltage ($V_2$), and the required accuracy of the low frequency output signal 125 when determining the required accuracy of the digital-to-analog conversion circuitry 234. In this exemplary embodiment, consider that the low frequency output signal 125 is required to be 32 kHz with an accuracy of 250 ppm. This means that the low frequency output signal 125 should be 32 kHz±4 Hz, because [32 kHz*(250 Hz/1E6 Hz)]=8 Hz, where 8 Hz is defined as an equal sided range between +4 Hz and −4 Hz. Thus, the digital-to-analog conversion circuitry 234 should be capable of providing the voltage $V_2$ as the input to the VCO 145 with sufficient accuracy to allow the low frequency output signal 125 to be generated to within 4 Hz of the desired frequency. The VCO 145 gain is used to determine the maximum input voltage change ($\Delta V_{2max}$) that can be accommodated with a corresponding change in frequency of no more than 4 Hz by using the equation $\Delta V_{2max}$=[4 Hz/$K_{VCO}$]. In this exemplary embodiment consider that $K_{VCO}$ equals 20 kHz/V. Thus, $\Delta V_{2max}$=[4 Hz/(20 kHz/V)]= 0.0002 V. The accuracy of the digital-to-analog conversion circuitry 234 is represented by the expression $2^{-(lsb)}$, where (lsb) is a positive integer value corresponding to the least significant bit. For the digital-to-analog conversion circuitry 234 to provide the voltage $V_2$ with an accuracy of at least 0.0002 V, the expression $2^{-(lsb)} \leq 0.0002$ must be satisfied. With $2^{-12}$=0.00024 and $2^{-13}$=0.00012, it is clear that the digital-to-analog conversion circuitry 234 must have an (lsb) of at least 13 (i.e., the digital-to-analog conversion circuitry 234 should be at least 13-bit accurate). The numerical values used in the exemplary embodiment above are provided for descriptive purposes. The present invention can be implemented with other numerical values as appropriate for the particular application.

As the digital-to-analog conversion circuitry 234 accuracy requirement increases, the current required to operate the digital-to-analog conversion circuitry 234 also increases. To minimize current usage is support of the low power mode of operation, the digital-to-analog conversion circuitry 234 accuracy requirement should be decreased to the extent practical. As shown in the aforementioned exemplary embodiment, the VCO 145 gain (i.e., $K_{VCO}$) directly affects the accuracy requirement of the digital-to-analog conversion circuitry 234. As the VCO 145 gain decreases, the required accuracy of the digital-to-analog conversion circuitry 234 decreases, vice-versa. Thus, to maintain minimal current usage, the accuracy requirement of the digital-to-analog conversion circuitry 234 should be minimized. To minimize the accuracy requirement of the digital-to-analog conversion circuitry 234, the VCO 145 gain should be maintained sufficiently low.

The VCO 145 gain dictates a change in frequency of the low frequency output signal 125 corresponding to a change in voltage $V_2$ provided as input to the VCO 145. With a low VCO 145 gain, the change in frequency over an operating voltage range of the VCO 145 will be correspondingly low, vice-versa. The PFD 133 requires the VCO, 145 low frequency output signal 125 to be adjustable in frequency over a range sufficiently broad as to facilitate acquisition of loop lock. To facilitate acquisition of loop lock while maintaining a sufficiently low gain, the VCO 145 of the present invention is segmented to operate using one of a plurality of gain response functions. Each gain response function is implementable from a minimum VCO 145 operating voltage to a maximum VCO 145 operating voltage. The frequency corresponding to the minimum VCO 145 operating voltage for each successive gain response function corresponds to the frequency of the previous gain response function at the maximum VCO 145 operating voltage. With the segmented VCO 145 configuration, the frequency of the low frequency output signal 125 can be adjusted over a broad range while remaining within the operating voltage range of the VCO 145. Furthermore, the VCO 145 gain can be maintained at a sufficiently low value to support the use of digital-to-analog conversion circuitry 234 having minimal accuracy with corresponding minimal power consumption.

In accordance with FIG. 7, a fifth digital control signal is provided from the digital circuitry 224 through a connection 211 to the VCO 145. The fifth digital control signal is used to control the selection of the active VCO 145 gain response function. The VCO 145 gain response functions are stepped through from lowest frequency to highest frequency until the desired frequency is reached allowing the PFD 133 to acquire loop lock. Once the appropriate VCO 145 gain response function is reached, a second digital latch 229 is activated to maintain the fifth digital control signal so that the VCO 145 will continue to operate using the appropriate gain response function.

In a preferred embodiment of the present invention, the modified PLL 201 receives as the clock reference signal 123 a substantially accurate input of 12 MHz and generates as the low frequency output signal 125 an output of 32 kHz. The output of 32 kHz is generated with an accuracy of 250 ppm or ±4 Hz. Through the implementation of the analog memory cell 207, the modified PLL 201 in this preferred embodiment is capable of maintaining the 32 kHz±4 Hz for a period of at least 41 seconds during the host device's sleep mode of operation. While operating in the sleep mode of operation in accordance with this preferred embodiment, the active components of the analog memory cell 207 and the modified PLL 201 (i.e., voltage band gap 238, digital-to-analog conversion circuitry 234, and VCO 145) consume less than 10 microamps of current. It should be appreciated by those skilled in the art that numerous alternate embodiments exist wherein other input signal frequencies and accuracies, other output signal frequencies and accuracies, other sleep mode duration times, and other current consumptions during sleep mode can be implemented and obtained.

Figure 8:
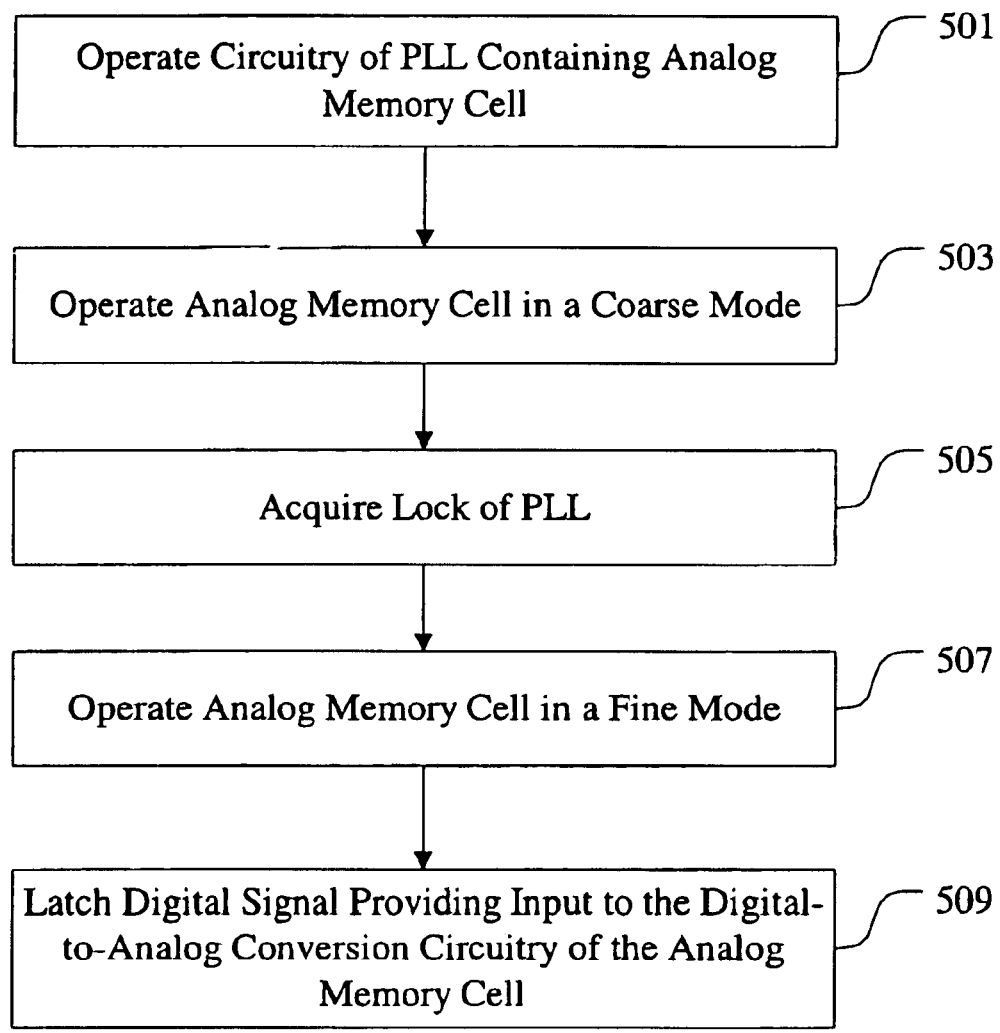
FIG. 8 is a flow chart illustrating a method for operating a modified phase lock loop, containing an analog memory cell, as a low power oscillator to generate an output signal of substantially constant frequency, in accordance with one embodiment of the present invention.

FIG. 8 is a flow chart illustrating a method for operating the modified PLL 201, containing the analog memory cell 207, as the LPO 121 to generate an output signal of substantially constant frequency, in accordance with one embodiment of the present invention. The method starts at a step 501 wherein the circuitry of the modified PLL 201 comprising the analog memory cell 207 is operating. A step 503 follows, wherein the analog memory cell 207 is operating in a coarse mode to acquire lock of the modified PLL 201. A step 505 follows, wherein lock of the modified PLL 201 is acquired. A step 507 follows, wherein the analog memory cell 207 is operating in a fine mode to track and refine the modified PLL 201 loop voltage. A step 509 follows, wherein the digital signal providing an input to the digital-to-analog conversion circuitry 234 is latched. The latching of the digital signal in step 509 ensures that the digital-to-analog conversion circuitry 234 provides a substantially constant input voltage to the VCO 145. With, a substantially constant input voltage, the VCO 145 generates the output signal of substantially constant frequency.

Figure 9:
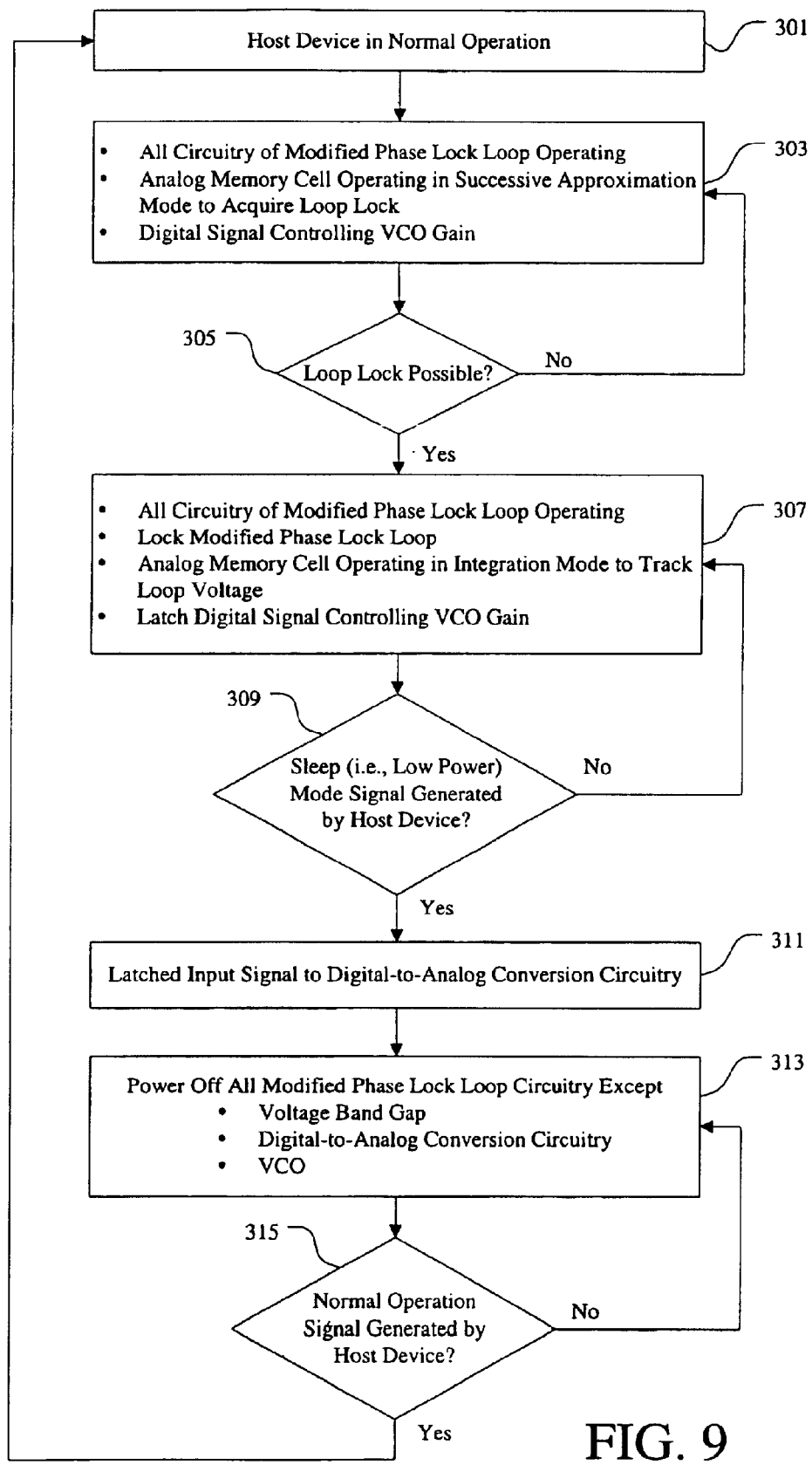
FIG. 9 is a flow chart illustrating a method for operating a modified phase lock loop, containing an analog memory cell, as a low power oscillator to support a sleep mode of operation, in accordance with one embodiment of the present invention.

FIG. 9 is a flow chart illustrating a method for operating the modified PLL 201, containing the analog memory cell 207, as the LPO 121 to support a sleep mode of operation, in accordance with one embodiment of the present invention. The method illustrated in FIG. 9 incorporates a more detailed representation of the method illustrated in FIG. 8. The method starts at a step 301 wherein the host device is operating in a normal mode of operation. A step 303 follows, wherein the entire modified PLL 201 circuitry is operating. In step 303, the analog memory cell 207 is operating in a successive approximation mode to acquire loop lock. Also in step 303, a digital signal is being provided by the analog memory cell 207 to control the gain of the VCO 145 and facilitate loop lock. The method continues with a decision step 305, wherein a question is posed as to whether loop lock is possible or not. If loop lock is not possible, the method continues by repeating step 303. If loop lock is possible, the method proceeds to a step 307. In step 307, the entire modified PLL 201 circuitry continues to operate. Also in step 307, the modified PLL 201 is locked and the digital signal controlling the gain of the VCO 145 is latched. Further in step 307, the analog memory cell 207 is operating in an integration mode to track the loop voltage. A decision step 309 follows, wherein a question is posed as to whether a sleep mode signal is being generated by the host device. If the sleep mode signal is not being generated, the method continues by repeating step 307. If the sleep mode signal is being generated, the method proceeds to a step 311. In step 311, the digital signal provided as an input to the digital-to-analog conversion circuitry 234 is latched. The method proceeds with a step 313, wherein all circuitry of the modified PLL 201 other than the voltage band gap 238, digital-to-analog conversion circuitry 234, and VCO 145 are powered off. A decision step 315 follows, wherein a question is posed as to whether a normal operation signal is being generated by the host device. If the normal operation signal is not being generated by the host device, the method continues by repeating step 313. If the normal operation signal is being generated by the host device, the method proceeds back to step 301, wherein the host device is operating in a normal mode of operation.

Figure 10:
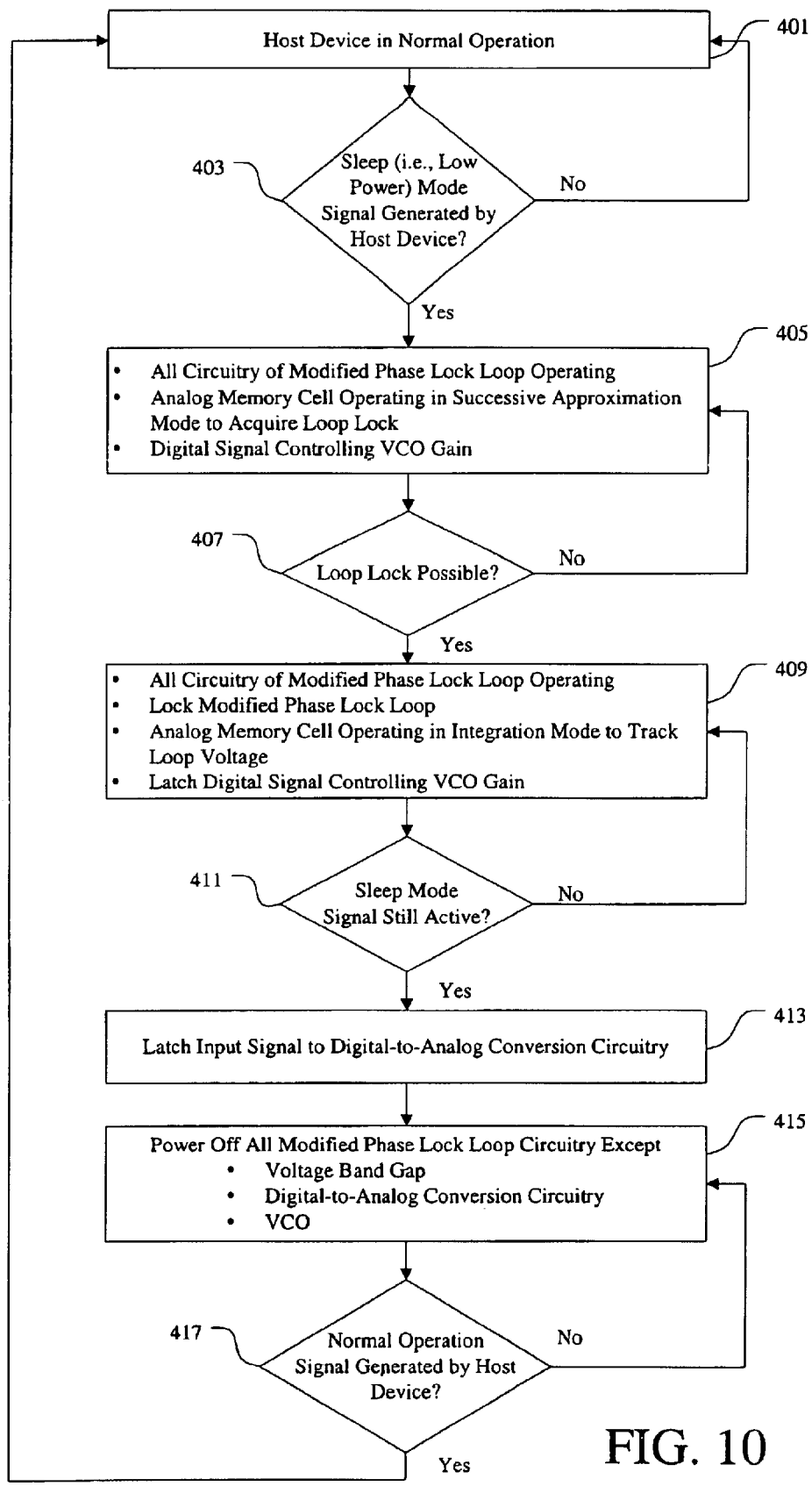
FIG. 10 is a flow chart illustrating a method for operating a modified phase lock loop, containing an analog memory cell, as a low power oscillator to support a sleep mode of operation, in accordance with another embodiment of the present invention.

FIG. 10 is a flow chart illustrating a method for operating the modified PLL 201, containing the analog memory cell 207, as the LPO 121 to support a sleep mode of operation, in accordance with another embodiment of the present invention. The method starts at a step 401 wherein the host device is operating in a normal mode of operation. A decision step 403 follows, wherein a question is posed as to whether a sleep mode signal is being generated by the host device. If the sleep mode signal is not being generated, the method continues by repeating step 401. If the sleep mode signal is being generated, the method proceeds to a step 405, wherein the entire modified PLL 201 circuitry is operating. In step 405, the analog memory cell 207 is operating in a successive approximation mode to acquire loop lock. Also in step 405, a digital signal is being provided by the analog memory cell 207 to control the gain of the VCO 145 and facilitate loop lock. The method continues with a decision step 407, wherein a question is posed as to whether loop lock is possible or not. If loop lock is not possible, the method continues by repeating step 405. If loop lock is possible, the method proceeds to a step 409. In step 409, the entire modified PLL 201 circuitry continues to operate. Also in step 409, the modified PLL 201 is locked and the digital signal controlling the gain of the VCO 145 is latched. Further in step 409, the analog memory cell 207 is operating in an integration mode to track the loop voltage. A decision step 411 follows, wherein a question is posed as to whether the sleep mode signal generated by the host device is still active. If the sleep mode signal is not still active, the method continues by repeating step 409. If the sleep mode signal is still active, the method proceeds to a step 413. In step 413, the digital signal provided as an input to the digital-to-analog conversion circuitry 234 is latched. The method proceeds with a step 415, wherein all circuitry of the modified PLL 201 other than the voltage band gap 238, digital-to-analog conversion circuitry 234, and VCO 145 are powered off. A decision step 417 follows, wherein a question is posed as to whether a normal operation signal is being generated by the host device. If the normal operation signal is not being generated by the host device, the method continues by repeating step 415. If the normal operation signal is being generated by the host device, the method proceeds back to step 401, wherein the host device is operating in a normal mode of operation.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the claimed invention.

What is claimed is:

1. A low power oscillator, comprising:
  a voltage controlled oscillator having an input and an output, the output configured to provide an output signal of substantially constant frequency; and an analog memory cell in electrical communication with the input of the voltage controlled oscillator, the analog memory cell configured to provide a voltage to the input of the voltage controlled oscillator, the analog memory cell having digital circuitry that includes a latch configured to provide a constant digital output signal when activated, and the analog memory cell including digital-to-analog conversion circuitry for receiving the constant digital output signal from the latch and outputting the voltage provided to the voltage controlled oscillator, wherein the voltage remains substantially constant when the latch is activated.

2. A low power oscillator as recited in claim 1, wherein the analog memory cell is further configured to provide a digital input signal to the input of the voltage controlled oscillator, the voltage controlled oscillator being configured to operate using one of a plurality of gain response functions, the digital input signal configured to control a selection from the plurality of gain response functions.

3. A low power oscillator as recited in claim 1, wherein the digital circuitry of the analog memory cell is configured to replicate an analog input voltage as a digital signal, the digital circuitry being further configured to maintain the digital signal in the absence of the analog input voltage.

4. A low power oscillator as recited in claim 1, wherein the input to the voltage controlled oscillator is derived from an external crystal during normal power operation of a host device and the input to the voltage controlled oscillator is provided by the analog memory cell during low power operation of the host device, the input to the voltage controlled oscillator remaining sufficiently constant to allow generation of the output signal of substantially constant frequency.

5. A low power oscillator as recited in claim 4, wherein the output signal of substantially constant frequency is maintained at a frequency in the range of 28 kHz to 36 kHz for at least a duration of 41 seconds, the duration being the time over which the analog memory cell provides a substantially constant input voltage to the voltage controlled oscillator.

6. A low power oscillator as recited in claim 1, wherein the analog memory cell comprises both analog circuitry and digital circuitry, both the analog circuitry and digital circuitry being implemented in a CMOS process.

7. A low power oscillator as recited in claim 1, comprising:

a low power oscillator input signal in electrical communication with a reference divider;

the reference divider in electrical communication with a phase frequency detector;

the phase frequency detector in electrical communication with a plurality of charge pumps;

the plurality of charge pumps in electrical communication with a resistor, wherein the resistor is in electrical communication with a capacitor;

the plurality of charge pumps in electrical communication with the analog memory cell;

a host device sleep mode controller in electrical communication with the analog memory cell;

the phase frequency detector in electrical communication with the analog memory cell;

the phase frequency detector in electrical communication with an N counter; and the voltage controlled oscillator in electrical communication with the N counter.

8. An analog memory cell, comprising:

digital-to-analog conversion circuitry configured to receive a first digital control signal and provide an output voltage;

comparator circuitry in electrical communication with the digital-to-analog conversion circuitry, the comparator circuitry configured to receive the output voltage from the digital-to-analog conversion circuitry, the comparator circuitry further configured to receive an input voltage, the comparator circuitry configured to compare the output voltage and the input voltage to generate a second digital control signal; and digital circuitry in electrical communication with both the comparator circuitry and the digital-to-analog conversion circuitry, the digital circuitry comprising a successive approximation logic block, an integration logic block, and a digital signal latch, the digital circuitry configured to receive the second digital control signal from the comparator circuitry, the digital circuitry further configured to process the second digital control signal through either the successive approximation logic block or the integration logic block to generate the first digital control signal, the digital signal latch capable of latching the first digital control signal.

9. An analog memory cell as recited in claim 8, wherein:

the successive approximation logic block is configured to coarsely modify the first digital control signal in a successive approximation mode;

the integration logic block is configured to finely modify the first digital control signal in an integration mode; and the digital signal latch is configured to maintain the first digital control signal substantially constant.

10. An analog memory cell as recited in claim 9, wherein the digital circuitry is in further electrical communication with a phase frequency detector, the digital circuitry configured to switch between successive approximation mode and integration mode in the presence of a third digital control signal received from the phase frequency detector, the third digital control signal indicating a loop lock detection.

11. An analog memory cell as recited in claim 10, wherein the digital circuitry is in further electrical communication with a host device sleep mode controller, the digital signal latch configured to latch the first digital control signal in the presence of both the third digital control signal and a fourth digital control signal received from the host device sleep mode controller, the fourth digital control signal indicating host device sleep mode operation.

12. An analog memory cell as recited in claim 8, wherein the digital circuitry is in further electrical communication with a voltage controlled oscillator, the digital circuitry configured to provide a fifth digital control signal to the voltage controlled oscillator, the digital circuitry further comprising a second digital signal latch, the second digital signal latch capable of latching the fifth digital control signal, the fifth digital control signal having the capability to control a gain response of the voltage controlled oscillator.

13. An analog memory cell as recited in claim 8, wherein the digital-to-analog conversion circuitry is in electrical communication with a voltage band gap, the voltage band gap configured to provide a substantially constant input voltage to the digital-to-analog conversion circuitry.

14. A method for providing a substantially constant voltage to operate a low power oscillator, comprising:

operating a phase lock loop comprising an analog memory cell;

operating the analog memory cell in a coarse mode to adjust a voltage generated by the analog memory cell;

acquiring a loop lock by operating the analog memory cell in the coarse mode;

operating the analog memory cell in a fine mode to adjust the voltage generated by the analog memory cell, wherein the voltage adjustments provided by the fine mode are of substantially small size relative to the voltage adjustments provided by the coarse mode; and latching a digital signal in the analog memory cell, wherein the digital signal provides an input to digital-to-analog conversion circuitry, wherein the input to digital-to-analog conversion circuitry dictates the voltage generated by the analog memory cell.

15. A method as recited in claim 14, wherein operating the analog memory cell in the coarse mode is equivalent to operating the analog memory cell in a successive approximation mode, the successive approximation mode incrementally adjusting the voltage generated by the analog memory cell, wherein the incremental adjusting occurs in substantially large sized increments relative to the fine mode.

16. A method as recited in claim 14, wherein operating the analog memory cell in the coarse mode comprises controlling a gain of a voltage controlled oscillator to acquire locking of the phase lock loop, wherein locking of the phase lock loop allows latching of the gain of the voltage controlled oscillator.

17. A method as recited in claim 14, wherein operating the analog memory cell in the fine mode is equivalent to operating the analog memory cell in an integration mode, the integration mode incrementally adjusting the voltage generated by the analog memory cell, wherein the incremental adjusting occurs in substantially small sized increments relative to the successive approximation mode.

18. A method as recited in claim 14, wherein operating the analog memory cell in the fine mode comprises tracking and refining the loop voltage.

19. A method as recited in claim 14, wherein latching of the digital signal in the analog cell occurs after acquisition of the loop lock and after receipt of a low power mode signal from host device.

20. A method as recited in claim 14, wherein latching of the digital signal in the analog cell remains in effect until a normal operation signal is received from a host device.

* * * * *